United States Patent
Tsai et al.

(10) Patent No.: US 8,519,512 B2
(45) Date of Patent: Aug. 27, 2013

(54) TEST LINE PLACEMENT TO IMPROVE DIE SAWING QUALITY

(75) Inventors: Hao-Yi Tsai, Hsinchu (TW); Chia-Lun Tsai, Hsinchu (TW); Shang-Yun Hou, Jubei (TW); Shin-Puu Jeng, Hsin-Chu (TW); Shih-Hsun Hsu, Keelung (TW); Wei-Ti Hsu, Keelung (TW); Lin-Ko Feng, Kaohsiung (TW); Chun-Jen Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1026 days.

(21) Appl. No.: 11/525,575

(22) Filed: Sep. 22, 2006

(65) Prior Publication Data

US 2008/0073753 A1    Mar. 27, 2008

(51) Int. Cl.
*H01L 23/544* (2006.01)

(52) U.S. Cl.
USPC ........... 257/620; 257/618; 257/775; 257/726; 257/E23.179

(58) Field of Classification Search
USPC .............. 257/620, 618, 775, 723, E23.179
See application file for complete search history.

(56) References Cited

U.S. PATENT DOCUMENTS

| | | | |
|---|---|---|---|
| 5,239,191 A | 8/1993 | Sakumoto et al. | |
| 5,285,082 A | 2/1994 | Axer | |
| 5,371,411 A | 12/1994 | Hara et al. | |
| 6,121,677 A | 9/2000 | Song et al. | |
| 6,124,143 A * | 9/2000 | Sugasawara | 438/18 |
| 6,358,839 B1 | 3/2002 | Li et al. | |
| 6,483,173 B2 | 11/2002 | Li et al. | |
| 6,876,946 B2 | 4/2005 | Yasuda et al. | |
| 2003/0003677 A1 | 1/2003 | Fukada | |
| 2003/0045010 A1* | 3/2003 | Byrd et al. | 438/14 |
| 2003/0124816 A1* | 7/2003 | Potts | 438/462 |
| 2004/0017217 A1* | 1/2004 | Ryu et al. | 324/763 |
| 2004/0207078 A1* | 10/2004 | Su et al. | 257/723 |
| 2007/0275539 A1* | 11/2007 | Rashid et al. | 438/460 |
| 2007/0290204 A1* | 12/2007 | Jao et al. | 257/48 |

FOREIGN PATENT DOCUMENTS

JP    2002176140 A    6/2002

OTHER PUBLICATIONS

Pidin, S., et al., "MOSFET Current Drive Optimization Using Silicon Nitride Capping Layer for 65-nm Technology Node," 2004 IEEE, 2004 Symposium on VLSI Technology Digest of Technical Papers, pp. 54-55.

* cited by examiner

*Primary Examiner* — Junghwa M Im
(74) *Attorney, Agent, or Firm* — Slater & Matsil, L.L.P.

(57) ABSTRACT

A semiconductor wafer structure includes a plurality of dies, a first scribe line extending along a first direction, a second scribe line extending along a second direction and intersecting the first scribe line, wherein the first and the second scribe lines have an intersection region. A test line is formed in the scribe line, wherein the test line crosses the intersection region. Test pads are formed in the test line and only outside a free region defined substantially in the intersection region.

18 Claims, 6 Drawing Sheets

TEST LINE PLACEMENT TO IMPROVE DIE SAWING QUALITY

CROSS-REFERENCE TO RELATED APPLICATIONS

This application relates to the following commonly assigned U.S. patent application Ser. No. 10/675,862, filed Sep. 30, 2003, entitled "Apparatus and Method for Manufacturing a Semiconductor Wafer with Reduced Delamination and Peeling," which patent application is incorporated herein by reference.

TECHNICAL FIELD

This invention relates to the manufacture of semiconductor wafers including low-k dielectric materials, and more particularly to a design rule for placing test lines.

BACKGROUND

IC manufacturers are employing finer circuit widths, low dielectric constant (low-k) materials, and other technologies to make small, high-speed semiconductor devices. Along with these advancements, the challenges of maintaining yield and throughput have also increased. With regard to reliability, the presence of low-k material near die corners increases the chances of cracks forming, especially in the sawing process.

A semiconductor wafer typically comprises substantially isolated dies (or chips) separated from each other by scribe lines. Individual dies within the wafer contain circuitry, and the dies are separated by sawing and are individually packaged. Alternately, the individual dies may be packaged in multi-chip modules. In a semiconductor fabrication process, the semiconductor device (e.g., an integrated circuit IC) must be continuously tested at every step so as to maintain and assure device quality. Usually, a testing circuit is simultaneously fabricated on the wafer along with the actual devices. A typical testing method provides a plurality of test pads, which are electrically coupled to an external terminal through probe needles, located on the scribe lines. The test pads are selected to test different properties of the wafer, such as threshold voltage, saturation current, gate oxide thickness, or leakage current. Test pads are formed along the scribe lines, thus a logical concept "test line" is used to refer to a strip-like region having test pads therein.

In general, the scribe lines are defined in areas of the multi-layer structure that are without a die pattern and that have a width of about 80 to 100 μm depending on the dimensions of the dies manufactured in the wafer. In order to prevent cracks induced during wafer sawing from propagating into the die, each die is usually surrounded by a seal ring of 3 to 10 μm in width. Nevertheless, during wafer manufacture, damage is often introduced because of the scribe lines. Further, when at least one layer of the multi-layer structure is composed of a metal material with a high thermal expansion coefficient, the dimensional variation of the layer is sufficient to introduce high-level internal stress into the wafer in the area of the scribe line. Consequently, portions of the wafer around the scribe line suffer damage, such as peeling, delamination, or dielectric fracture. The types of scribe line damage mentioned above are usually observed when the multi-layer structure includes an inter-metal-dielectric layer of low dielectric constant (low-k).

When considering a design rule for the placement of test pads on the scribe line, a major consideration is that the stress resulting from the sawing process causes serious peeling near the test pads at the die corners. This results in delamination at the interface between the multiple layers at the die corners. Delamination impacts the reliability of the device and contributes to production of stringers (residual materials) that interfere with further processing and testing of the integrated circuit.

Figure 1:
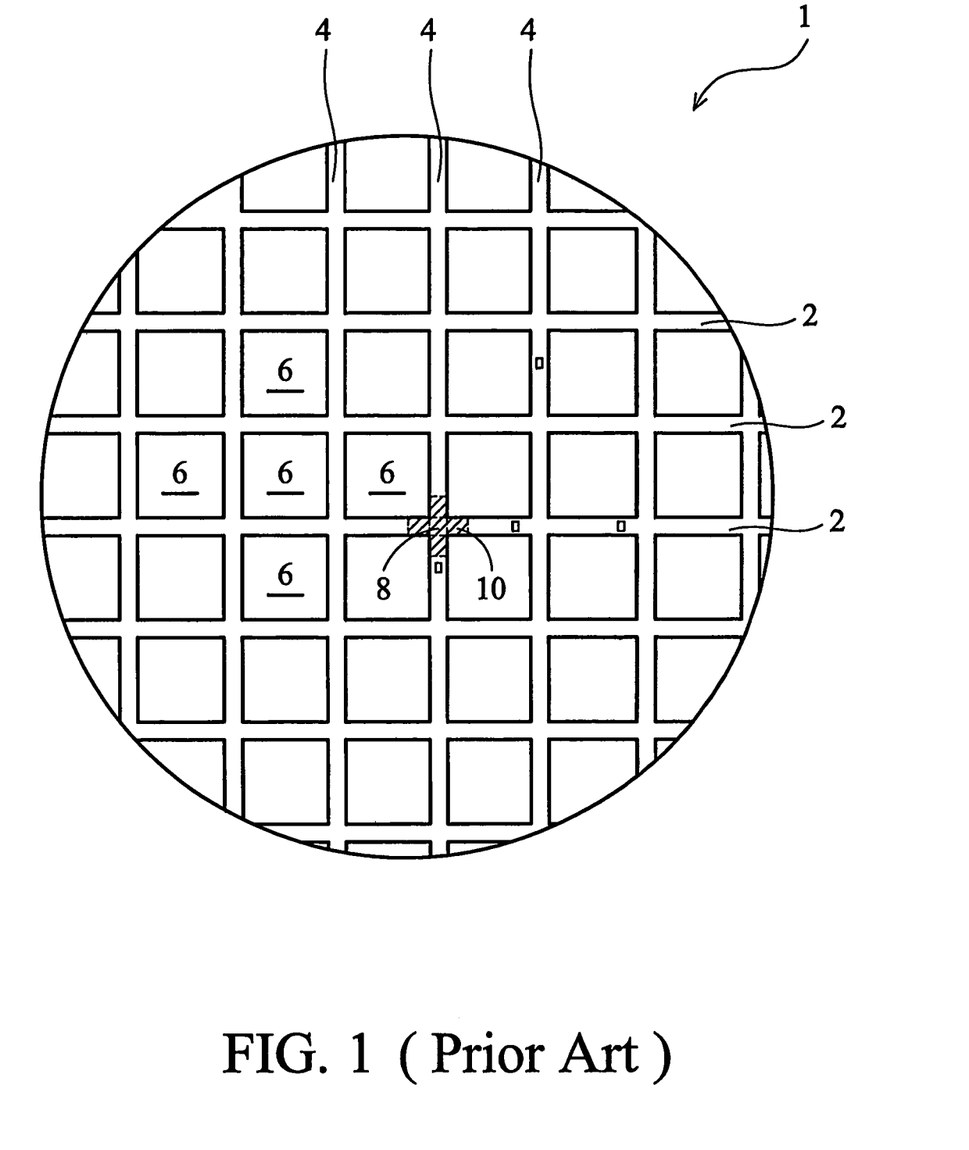
FIG. 1 illustrates a conventional semiconductor wafer with a free area for placing test pads.

U.S. patent Publication Ser. No. 10/675,862 discusses a design rule for reducing the peeling of low-k dielectric materials at the corners of dies. Referring to FIG. 1, a top view of a wafer with dies is shown. The semiconductor wafer 1 comprises dies (or chips) 6 separated from each other by first scribe lines 2 and second scribe lines 4. The first scribe lines 2 extend along a first direction and the second scribe lines 4 extend along a second direction. One of the first scribe lines and one of the second scribe lines define an intersection area 8.

A free area 10, which is shaded, is defined. The free area 10 may include the intersection area 8 and regions near the corners of dies. Preferably, no test pads are placed in the free area.

The above-discussed design rule, however, leads to the restriction of test line placement across scribe lines. With the free area excluding the placement of test pads, test lines, in which test pads are formed, may not be able to cross the free area and may have to be placed on either side of the free area. A direct result is that the test lines need to have lengths less than the length of the dies. When the test line length is greater than the available length of dies, extra space may have to be reserved between the dies in order to place the test lines. This results in the waste of wafer area and a reduction in the number of chips per wafer.

What is needed, therefore, is a novel design rule and resulting structure that may reduce the peeling of low-k dielectric material, while at the same time applying the least possible restriction to test line design and placement.

SUMMARY OF THE INVENTION

In accordance with one aspect of the present invention, a semiconductor wafer structure includes a plurality of dies, a first scribe line extending along a first direction, a second scribe line extending along a second direction and intersecting the first scribe line, wherein the first and the second scribe lines have an intersection region. A test line is formed in the first scribe line, wherein the test line crosses the intersection region. Test pads are formed in the test line, wherein the test pads are formed only out of a free region defined substantially in the intersection region.

In accordance with another aspect of the present invention, a semiconductor wafer structure includes a die region extending from a bottom surface to a top surface of the semiconductor wafer, a scribe line region adjacent the die region and extending from the bottom surface to the top surface of the semiconductor wafer, test devices in the scribe line region, a plurality of test pads formed in the scribe line region and in a plurality of dielectric layers. The test pads in a top dielectric layer are connected to the test devices and the test pads in the underlying dielectric layers. The test pads form test lines in the respective dielectric layers. At least one of the test lines crosses an intersection region of the scribe line region and an additional scribe line region perpendicular to the scribe line region. The semiconductor wafer structure further includes a free region defined substantially by the intersection region, wherein formation of test pads in the free region is prohibited.

In accordance with yet another aspect of the present invention, a semiconductor wafer structure includes a first scribe line extending along a first direction and adjacent a die, a first maximum kerf region in the first scribe line, a second scribe line extending along a second direction adjacent the die wherein the first and the second scribe lines have an intersection region, a second maximum kerf region in the second scribe line, a test line in the first scribe line, wherein the test line crosses the intersection region, a free region defined by an overlap region of the first and the second maximum kerf regions, and test pads in the test line and only outside a free region.

In accordance with yet another aspect of the present invention, a method of fabricating a semiconductor structure includes providing a semiconductor wafer having a first scribe line and a second scribe line, reserving a location for a test line, wherein the location is in the first scribe line and crosses an intersection area of the first scribe line and the second scribe line, defining a free region in the intersection area wherein a probability of kerf lines being outside the free region is substantially low, forming test pads in the location, wherein two of the test pads are placed on opposite sides of the free region, and the free region is free from test pads, sawing through the first scribe line, and sawing through the second scribe line to separate dies.

The advantageous feature of the present invention includes preventing test pads from being sawed more than once, so that the low-k dielectric peeling problem is significantly reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

It has been discovered that one of the important causes of the peeling problem is the sawing of test pads, which are typically formed of metals and have significantly greater mechanical strength than the low-k dielectric materials in which the test pads are formed. The problem is further worsened when the test pads are placed in the intersection region of the perpendicular scribe lines, so that the test pads are sawed twice, each in one direction. The preferred embodiment of the present invention provides a solution to avoid test pads being sawed twice.

Figure 2A:
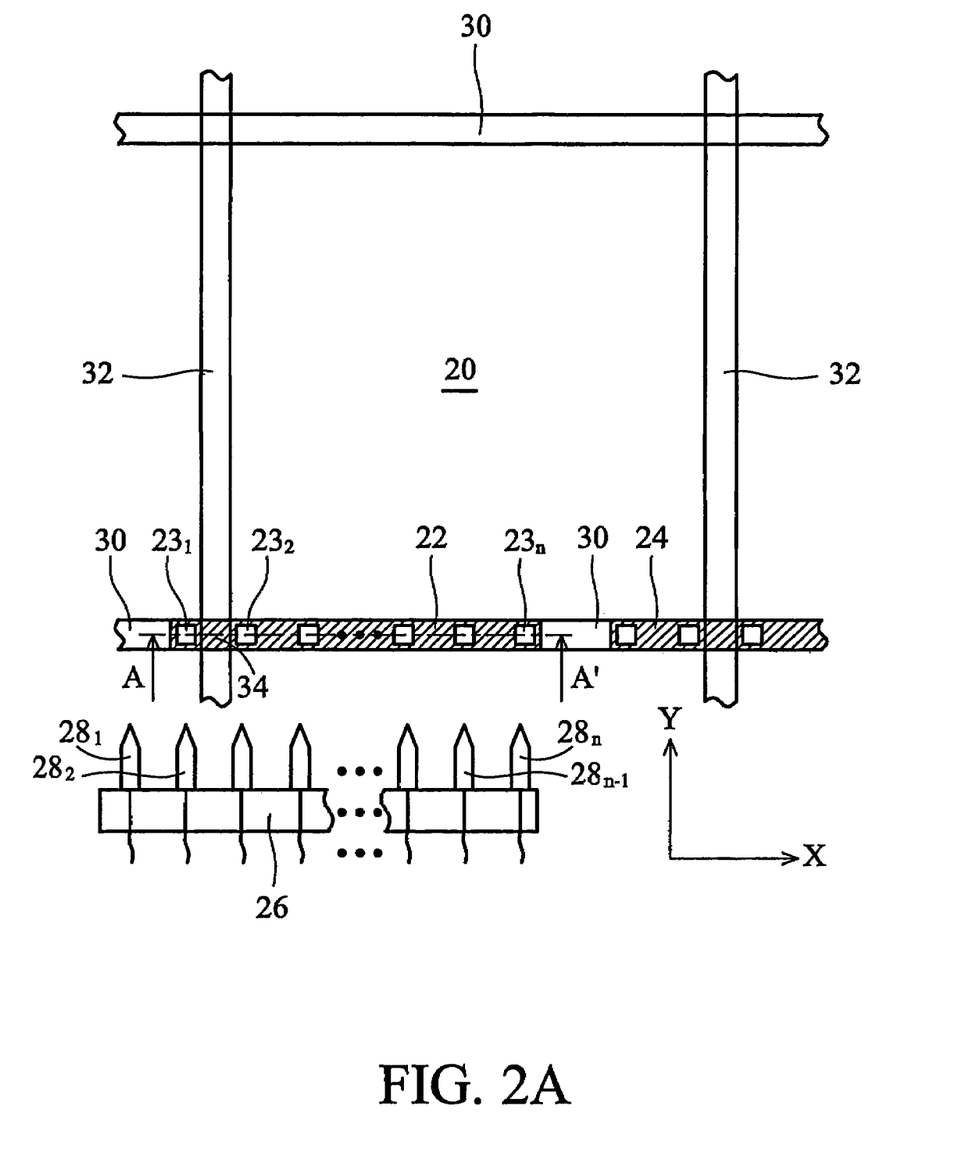
FIG. 2A illustrates a preferred embodiment of the present invention, wherein a test line is placed across an intersection region of scribe lines, and wherein test pads are placed outside the intersection region.

FIG. 2A illustrates a top view of the preferred embodiment. A chip 20, which is part of a wafer, is enclosed by first scribe lines 30 and second scribe lines 32. The first scribe lines 30 are in the X direction, and the second scribe lines 32 are in the Y direction. Test lines may be formed on first scribe lines 30 and/or second scribe lines 32.

A test line 22 and a test line 24 are shown in FIG. 2A. As is known in the art, test lines are designed for the convenience of the tests, which may be performed during and after the fabrication of integrated circuits, but before sawing the wafer. Test line 22 includes a plurality of test pads 23 numbered from $23_1$ through $23_n$, which are spaced apart, and preferably in equal distances.

Electrical contacts to test pads $23_1$ through $23_n$ are made through probe needles $28_1$ through $28_n$, respectively, which are assembled on a schematically shown probe card 26. Probe needles $28_1$ through $28_n$ are connected to wires, which are further connected to a die-sort machine. The spacings between the probe needles $28_1$ through $28_n$ correspond to the respective spacings of the test pads $23_1$ through $23_n$. When a test is performed, the probe card 26 is placed above the test line 22, so that the probe needles $28_1$ through $28_n$ are in electrical contact with corresponding test pads $23_1$ through $23_n$. The devices/circuits connected to the test pads can then be tested by the die-sort machine. After the test is finished, probe card 26 may be moved to test line 24 to perform a similar test.

Preferably, test lines on a same wafer have same lengths, and the spacings between the test pads are the same from test line to test line. If one test line has a different length and/or spacing from another test line, different probe cards have to be made to be compatible with the test lines having difference spacing. This is undesirable since higher cost and complexity are involved.

In the preferred embodiment, as shown in FIG. 2A, test line 22 is placed across an intersection region 34, which is an overlap region of one of the scribe lines 30 and one of the scribe lines 32. A free region is defined substantially in the intersection region 34, wherein a free region is the region in which the placement of the test pads is restricted, and design rules are made accordingly to ensure that no test pads are placed in the free region. In the preferred embodiment, the free region is intersection area 34. The position of the test line 22 is preferably fine tuned, so that no test pads are placed in the free region 34. When the wafer is sawed along the scribe line 32, the test pads $23_1$ through $23_n$ are very likely to be sawed in the X direction. However, none of the test pads $23_1$ through $23_n$ will be sawed in the Y direction. This significantly reduces the likelihood of low-k dielectric peeling.

Figure 2B:
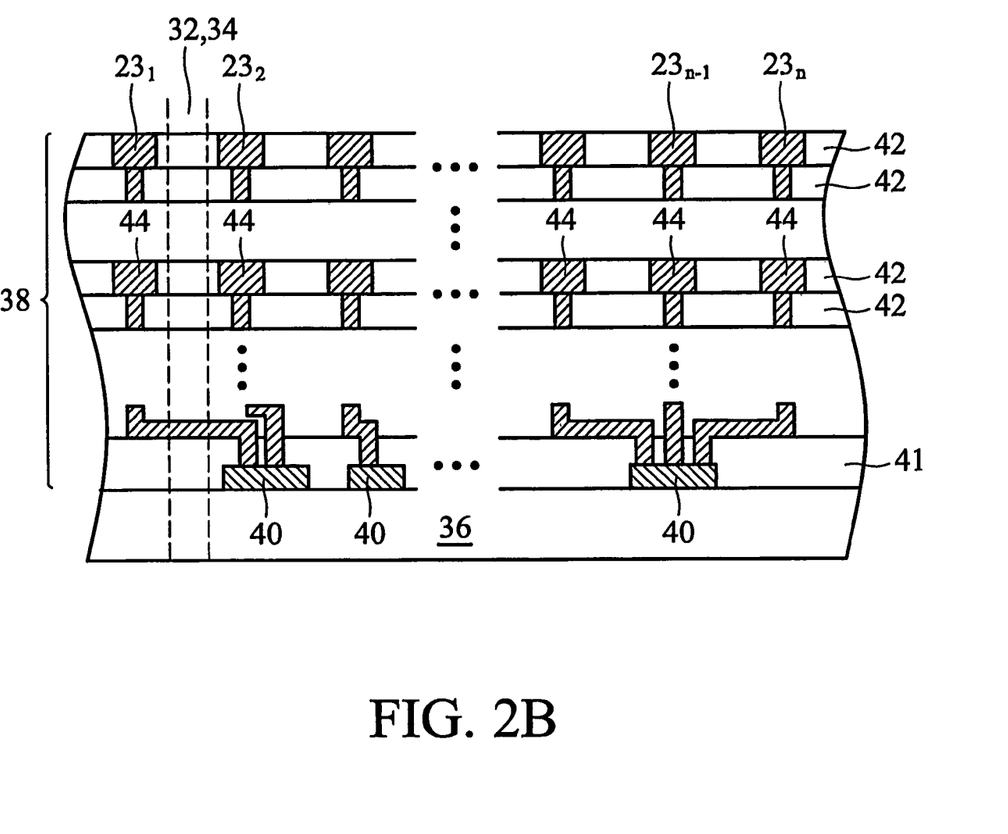
FIG. 2B illustrates a cross-sectional view of the structure shown in FIG. 2A.

A cross-sectional view of FIG. 2A, which is taken along a plane crossing a line A-A', is shown in FIG. 2B. The scribe line 30 is shown as a multi-layer structure 38 on a substrate 36. Substrate 36 may be fabricated using bulk Si, SOI, SiGe, GaAs, InP, or other semiconductor materials. Schematically illustrated devices/circuits 40 are formed on the substrate 36. The multi-layer structure 38 preferably comprises a plurality of dielectric layers 42 and a plurality of metallization layers and connecting vias formed therein. More test lines, such as the test line formed of test pads 44, are formed in metallization layers underlying the top metallization layer. A manufacturing process of the structure shown in FIG. 2B is briefly discussed using illustrations of FIGS. 2C and 2D.

Figure 2C:
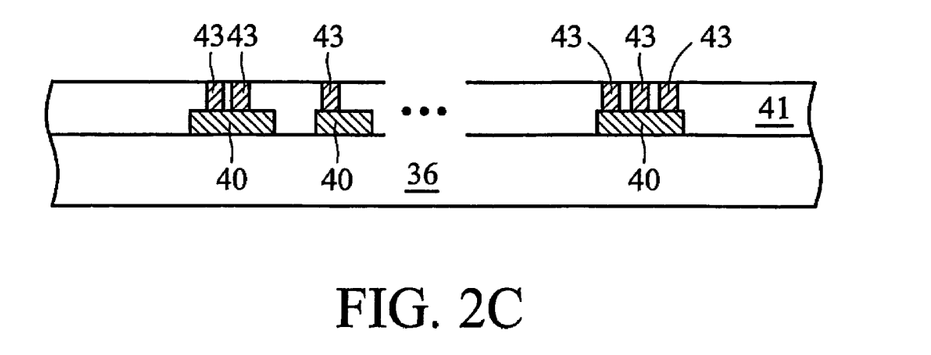
FIGS. 2C and 2D are cross-sectional views of intermediate stages in the manufacture of a preferred embodiment shown in FIGS. 2A and 2B.

Referring to FIG. 2C, test devices/circuits 40 are formed on substrate 36 and in the scribe line regions. Preferably, test devices/circuits 40 are formed using the same process steps used for forming the integrated circuits in the die regions. An inter-layer dielectric (ILD) 41 is formed over the substrate 36, followed by the formation of contact plugs 43 in ILD 41. Contact plugs 43 are preferably formed by etching contact openings in ILD 41 and filling the openings with conductive materials, which preferably comprise tungsten, aluminum, copper, or other well-known alternatives. Contact plugs 43 may have composite structures, including, e.g., barrier and adhesion layers.

Figure 2D:
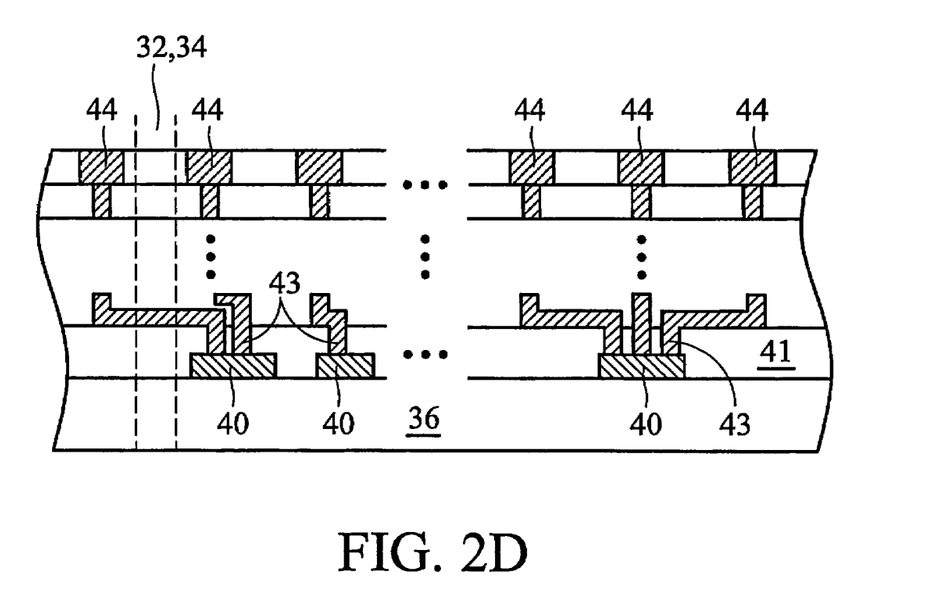

A plurality of metallization layers and connecting vias are formed over the ILD 41 to electrically connect and route electrical connections. A resulting structure is shown in FIG. 2D. Preferably, single or dual damascene processes are performed to form vias and metallization layers. As is known in the art, in a damascene process, openings (trench openings and via openings) are formed in the dielectric layers. A metallic material, preferably copper or copper alloys, is filled in the openings, and a chemical mechanical polish (CMP) is then performed to remove excess metallic material. Preferably, at least one of the dielectric layers 42 is a low-k dielectric layer having a dielectric constant (k) lower than about 3.5, and more preferably lower than about 3.0.

In the preferred embodiment, as shown in FIG. 2D, test pads 44 are formed in the first metallization layer, and the connections to the devices/circuits 40 are routed through test pads 44. In alternative embodiments, test pads 44 may be formed starting from a metallization layer over the first metallization layer. The spacings between the test pads 44 preferably correspond to the respective spacings of the probe needles 28 (refer to FIG. 2A). Test pads 44 thus form a test line in the respective metallization layer. Preferably, no test pad 44 is formed in the intersection region 34 of the scribe lines 30 and 32.

Dielectric layers and test pads are formed layer by layer, until the test pads 23 in the top metallization layer are formed. The resulting structure is shown in FIGS. 2A and 2B. For purposes of illustration, test pads 23 are shown vertically aligned to and overlying the respective test pads 44. In many embodiments, the various metal lines and vias will be laterally displaced from one another depending upon the design and layout preferences.

In the preferred embodiment, the free region is defined as the intersection region 34 of the scribe lines 30 and 32, and the free region 34 preferably extends from the top surface to the bottom surface of the wafer. Preferably, no test pads are formed within the free region 34, although a metal line connected to a test pad may extend across the free region 34. In other embodiments, the free region is a sub region within the intersection region 34, wherein the embodiments of the free regions are discussed in detail in subsequent paragraphs.

Tests may be performed after the test pads on each metallization layer are formed. For example, the probe needles 28 (refer to FIG. 2) are put into contact with the test pads 44 so that electrical connections are made to the devices/circuits 40. More test pads may be formed in the overlying metallization layers. Throughout the description, the term "test pads" is used to refer to not only test pads in the top metallization layer, such as test pads $23_1$ through $23_n$, but also the underlying pads 44.

Figure 3:
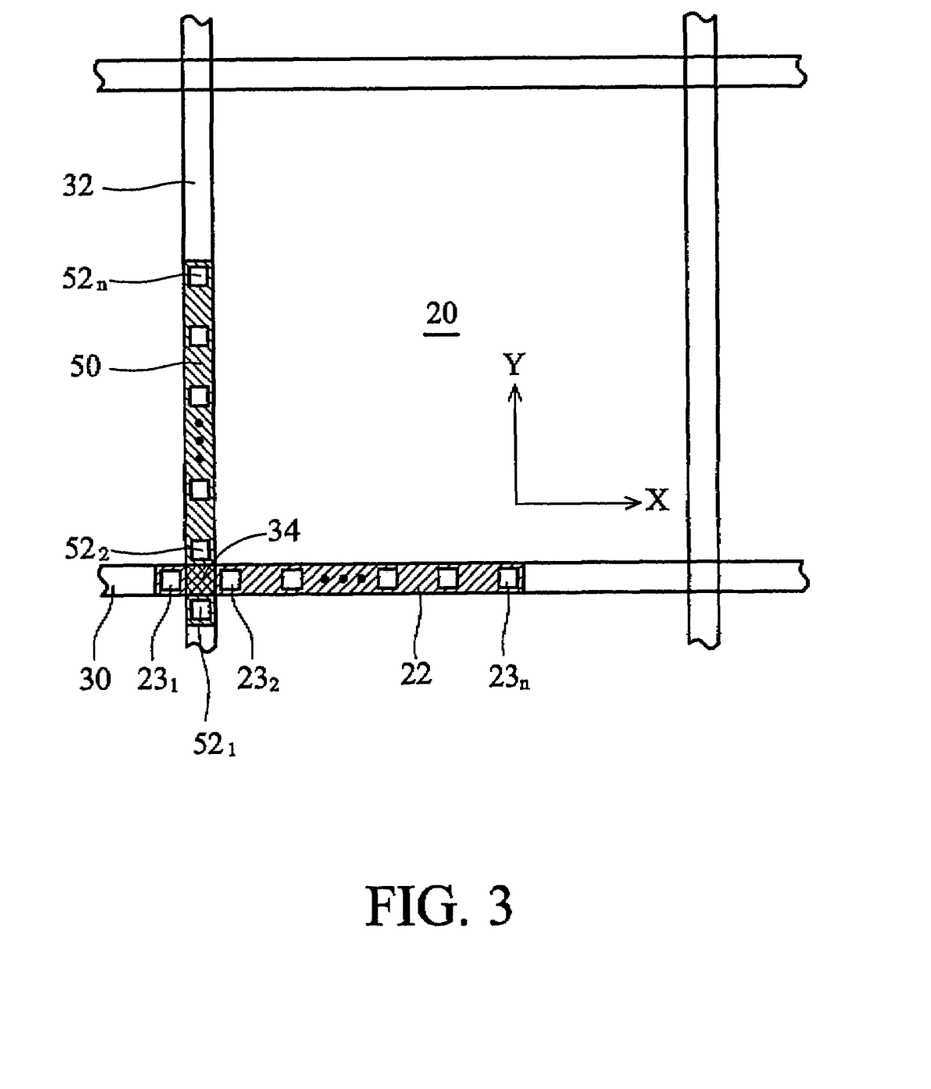
FIG. 3 illustrates a preferred embodiment of the present invention, wherein two perpendicular test lines are placed across an intersection region of scribe lines and out of the intersection region.

In a further embodiment of the present invention, as shown in FIG. 3, test lines are formed in both X and Y directions and may overlap each other. One test line 22 is placed in the scribe line 30, which is in X direction. Test line 22 is preferably placed across the intersection region 34. Another test line 50 is placed in scribe line 32, which is in Y direction. Test pads 52 are formed in test line 50. Test line 50 may also be placed across the intersection region 34. In this embodiment, a free region is defined as the intersection region 34. Preferably, test pads 23 and test pads 52 are formed outside the free region 34. The result will be that test pads 23 will be sawed in X direction, and test pads 52 will be sawed in Y direction. However, no test pads will be sawed in both directions.

Figure 4:
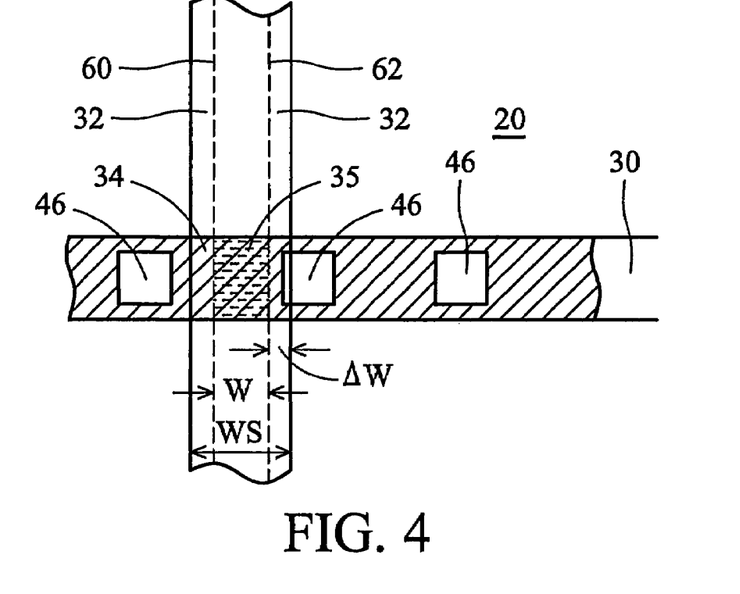
FIGS. 4 and 5 illustrate free regions defined inside an intersection region of two intersecting scribe lines.

In further embodiments, as shown in FIG. 4, free region 35 is determined with respect to accumulated data obtained from wafers already cut. Scribe lines typically have a width of between about 80 and about 100 μm, and greater than the kerf width, which is typically about 50 μm. Preferably, sawing will be along the center of the scribe line, although in practical sawing operations, the kerfs are likely to deviate from the centerline. However, in a certain semiconductor fabrication process using certain equipment, there is typically a maximum variation that the kerfs may deviate from the center of the scribe line. Assuming accumulated data has indicated that kerfs are located between lines 60 and 62, which define a smaller area than the intersection region 34, the probability of kerfs reaching beyond the lines 60 and 62 is substantially low, for example, less than about one percent. Lines 60 and 62 are referred to as maximum kerf lines. Therefore, the free region 35 is defined to be a rectangular region defined by lines 60 and 62 and the boundaries of scribe line 30. In an exemplary embodiment, the free region 35 has a width W of less than about 65 percent of the width WS of the scribe lines. In other words, assuming a distance from an edge of the free region 35 to an edge of the intersection region 34 is ΔW, then ΔW/WS is preferably greater than about 17.5 percent.

In the embodiments shown in FIG. 4, test pads 46 may be placed out of the free region 35 but have a portion in the intersection region 34. Since the kerfs are more likely to be aligned to the center of the scribe lines 32, the possibility of the test pad 46 being sawed twice is substantially low.

Figure 5:
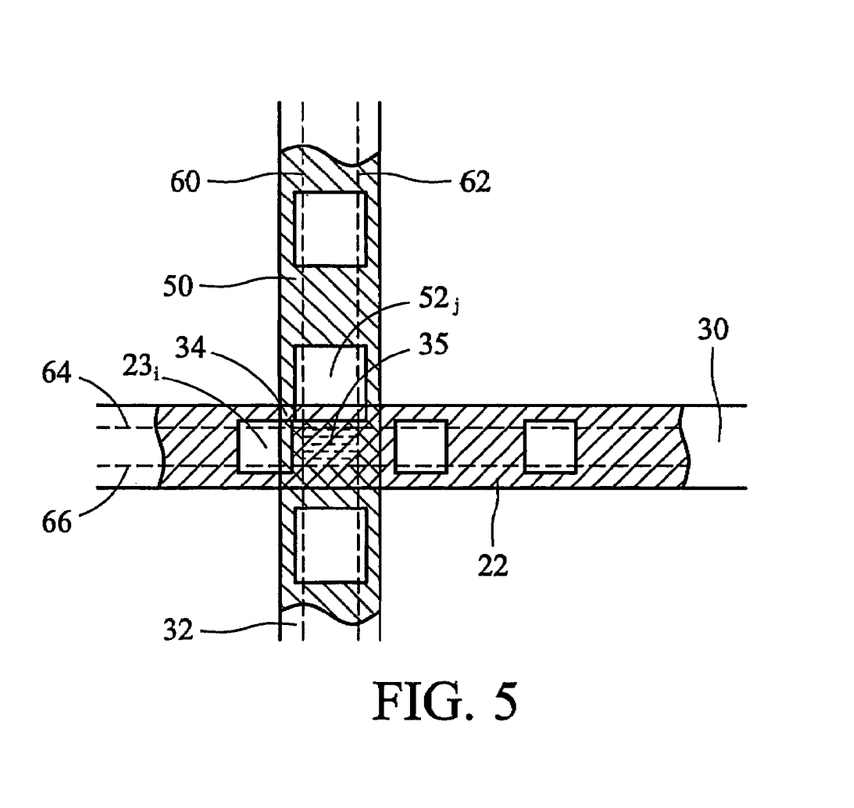

Referring to FIG. 5, the free region 35 is inside the intersection region 34 and is defined by lines 60, 62, 64 and 66, which are also empirical kerf boundaries. Test lines 22 and 50 are perpendicular test lines. At least one, and maybe both, test line(s) can be placed across the free region 35. In an exemplary embodiment, a test pad $52_j$ are placed within the intersection region 34 but outside the free region 35.

One skilled in the art will realize that although test lines 22 and/or 50 are shown to be across the intersection region 34 in the preferred embodiment, they can also be formed without crossing the intersection region 34.

By using the preferred embodiments of the present invention, a test pad will be sawed at most once. The low-k dielectric peeling problem is thus significantly reduced. The test lines can be placed across the intersection region of the scribe lines. This not only provides greater flexibility for test line placement, but the length of test lines and the number of test pads Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor wafer structure comprising:
   a plurality of dies;
   a first scribe line extending along a first direction;
   a second scribe line extending along a second direction and intersecting the first scribe line, wherein the first scribe line intersects the second scribe line defining an intersection region;
   a first test line in the first scribe line, wherein the first test line comprises a first conductive line crossing through the intersection region;
   a second test line in the second scribe line and perpendicular to the first test line, wherein the second test line comprises a second conductive line crossing through the intersection region and overlying a portion of the first conductive line; and
   first test pads in the first test line, wherein the first test pads are formed only outside a free region defined within the intersection region, and wherein at least a portion of at least one test pad is disposed within the intersection region.

2. The semiconductor wafer structure of claim 1, wherein the plurality of dies further comprises a low-k dielectric layer.

3. The semiconductor wafer structure of claim 2, wherein the low-k dielectric layer has a dielectric constant of less than about 3.5.

4. The semiconductor wafer structure of claim 3, wherein the dielectric constant is less than about 3.0.

5. The semiconductor wafer structure of claim 1, wherein a side of the free region has a distance from a respective side of the intersection region, and wherein the distance is greater than about 17.5 percent of a width of the first and the second scribe lines.

6. The semiconductor wafer structure of claim 1, wherein the free region is defined by maximum kerf lines in the first and the second scribe lines.

7. The semiconductor wafer structure of claim 1, wherein the free region extends from a top surface of the semiconductor wafer structure to a bottom surface of the semiconductor wafer structure.

8. A semiconductor wafer structure comprising:
   a die region extending from a bottom surface to a top surface of a semiconductor wafer;
   a first scribe line region adjacent the die region and extending from the bottom surface of the semiconductor wafer to the top surface of the semiconductor wafer and having a first kerf region defined therein;
   a second scribe line region perpendicular to the first scribe line region and having a second kerf region defined therein;
   test devices in the first kerf region;
   a plurality of test pads in the first scribe line region and in a plurality of dielectric layers, wherein test pads in a top dielectric layer of the semiconductor wafer are connected to the test devices by first conductive lines and underlying test pads in the plurality of dielectric layers, and wherein the test pads in the plurality of dielectric layers and the first conductive lines form first test lines in respective dielectric layers;
   a second conductive line forming a second test line and disposed in the second kerf region; and
   a free region defined by an overlap region of the first kerf region and second kerf region, the free region disposed in an intersection region of the first scribe line region and second scribe line region perpendicular to the first scribe line region;
   wherein at least one of the first conductive lines crosses through the free region and wherein the second conductive line crosses though the free region and overlies a portion of the first conductive line;
   wherein a distance between each edge of the free region to a nearest edge of the scribe line region is greater than about 17.5 percent of a width of the scribe line region; and
   wherein test pads in the at least one of the first test lines are formed outside the free region, and wherein at least a portion of at least one of the plurality of test pads is disposed within the intersection region.

9. The semiconductor wafer structure of claim 8, wherein at least one of the plurality of dielectric layers comprises a low-k dielectric material.

10. The semiconductor wafer structure of claim 9, wherein the low-k dielectric material has a k value of less than about 3.5.

11. The semiconductor wafer structure of claim 8, wherein the test pads in a same dielectric layer have substantially equal spacings.

12. A semiconductor wafer structure comprising:
    a first scribe line extending along a first direction and adjacent a die;
    a first maximum kerf region in the first scribe line and having a first width less than a width of the first scribe line;
    a second scribe line extending along a second direction adjacent the die, wherein the first scribe line intersects the second scribe line at an intersection region;
    a second maximum kerf region in the second scribe line and having a second width less than a width of the second scribe line;
    a test line in the first scribe line, wherein the test line comprises a conductive line crossing through the intersection region;
    a free region defined by an overlap region of the first and the second maximum kerf regions, respectively, the free region having a size smaller than the intersection region of the first scribe line and the second scribe line; and
    test pads in the test line and only outside the free region, wherein a portion of at least one test pad is disposed within the intersection region, the at least one test pad extending from outside the intersection region into the intersection region.

13. The semiconductor wafer structure of claim 12, wherein the test pads are located in a top metallization layer and underlying metallization layers.

14. The semiconductor wafer structure of claim 13, wherein the tests pads in the top metallization layer have spacings substantially identical to spacings of test pads in the underlying metallization layers.

15. The semiconductor wafer structure of claim 1, wherein the width of the first and second scribe lines is between about 80 μm and 100 μm.

16. The semiconductor wafer structure of claim 8, wherein the width of the scribe line region is between about 80 μm and 100 μm.

17. The semiconductor wafer structure of claim 12, wherein the widths of the first and second scribe lines are between about 80 μm and 100 μm.

18. The semiconductor wafer structure of claim 1, wherein the at least one test pad extends from outside the intersection region into the intersection region.

* * * * *